(12) United States Patent
Lee et al.

(10) Patent No.: US 10,971,513 B2
(45) Date of Patent: Apr. 6, 2021

(54) THREE-DIMENSIONAL SEMICONDUCTOR MEMORY DEVICES AND METHOD OF MANUFACTURING THE SAME

(71) Applicant: Samsung Electronics Co., Ltd., Suwon-si (KR)

(72) Inventors: Bongyong Lee, Suwon-si (KR); Tae Hun Kim, Gwacheon-si (KR); Minkyung Bae, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/265,688

(22) Filed: Feb. 1, 2019

(65) Prior Publication Data

US 2020/0020717 A1  Jan. 16, 2020

(30) Foreign Application Priority Data

Jul. 16, 2018  (KR) ........................ 10-2018-0082357

(51) Int. Cl.
| | | |
|---|---|---|
| H01L 27/11 | (2006.01) | |
| H01L 27/11582 | (2017.01) | |
| H01L 27/11524 | (2017.01) | |
| H01L 27/11556 | (2017.01) | |
| H01L 27/1157 | (2017.01) | |
| G11C 16/04 | (2006.01) | |

(52) U.S. Cl.
CPC .... H01L 27/11582 (2013.01); H01L 27/1157 (2013.01); H01L 27/11524 (2013.01); H01L 27/11556 (2013.01); G11C 16/0483 (2013.01); G11C 2216/04 (2013.01)

(58) Field of Classification Search
CPC combination set(s) only.
See application file for complete search history.

(56) References Cited

U.S. PATENT DOCUMENTS

| | | |
|---|---|---|
| 8,717,814 B2 | 5/2014 | Choi et al. |
| 9,190,416 B2 | 11/2015 | Lee et al. |
| 9,305,933 B2 | 4/2016 | Lee |
| 9,520,408 B2 | 12/2016 | Kim |
| 9,520,409 B2 | 12/2016 | Kim et al. |
| 9,536,894 B2 | 1/2017 | Tajima et al. |
| 9,837,436 B2 | 12/2017 | Lee et al. |
| 2013/0009236 A1* | 1/2013 | Lee ................... H01L 27/11578 257/329 |
| 2015/0340370 A1* | 11/2015 | Kim .................. H01L 21/76897 365/185.18 |
| 2015/0348983 A1* | 12/2015 | Son ................... H01L 27/11582 257/315 |
| 2017/0162578 A1* | 6/2017 | Noh .................. H01L 27/11582 |
| 2018/0006055 A1 | 1/2018 | Kim et al. |

* cited by examiner

*Primary Examiner* — Moin M Rahman
(74) *Attorney, Agent, or Firm* — Muir Patent Law, PLLC

(57) ABSTRACT

A three-dimensional (3D) semiconductor memory device may include a stack structure including gate electrodes sequentially stacked on a substrate, and a vertical channel penetrating the stack structure. The gate electrodes may include a ground selection gate electrode, a cell gate electrode, a string selection gate electrode, and an erase gate electrode, which are sequentially stacked on the substrate.

20 Claims, 13 Drawing Sheets

THREE-DIMENSIONAL SEMICONDUCTOR MEMORY DEVICES AND METHOD OF MANUFACTURING THE SAME

CROSS-REFERENCE TO RELATED APPLICATION

This U.S. non-provisional patent application claims priority under 35 U.S.C. § 119 to Korean Patent Application No. 10-2018-0082357, filed on Jul. 16, 2018, in the Korean Intellectual Property Office, the disclosure of which is hereby incorporated by reference in its entirety.

BACKGROUND

Embodiments of the inventive concepts relate to three-dimensional (3D) semiconductor memory devices, for example, 3D semiconductor memory devices with improved electrical characteristics.

Semiconductor memory devices have been highly integrated to provide excellent performance and low manufacture costs. The integration density of semiconductor memory devices directly affects the costs of the semiconductor memory devices, thereby resulting in a demand of highly integrated semiconductor memory devices. The integration density of two-dimensional (2D) or planar semiconductor memory devices may be mainly determined by an area where a unit memory cell occupies. Therefore, the integration density of the 2D or planar semiconductor memory devices may be greatly affected by a technique of forming fine patterns. However, since extremely high-priced apparatuses are needed to form fine patterns, the integration density of 2D semiconductor devices continues to increase but is still limited. Thus, three-dimensional (3D) semiconductor memory devices have been developed to overcome the above limitations. 3D semiconductor memory devices may include memory cells three-dimensionally arranged.

SUMMARY

Embodiments of the inventive concepts may provide three-dimensional (3D) semiconductor memory devices with improved electrical characteristics.

In an aspect, a 3D semiconductor memory device may include a stack structure including gate electrodes sequentially stacked on a substrate, and a vertical channel penetrating the stack structure. The gate electrodes may include a ground selection gate electrode, a cell gate electrode, a string selection gate electrode, and an erase gate electrode, which are sequentially stacked on the substrate.

In an aspect, a 3D semiconductor memory device may include a first erase gate electrode formed on a substrate, a vertical channel disposed on the substrate and penetrating the first erase gate electrode, and a conductive pad disposed in an inner space surrounded by the vertical channel. The conductive pad and the first erase gate electrode each include a portion at the same vertical level.

In an aspect, a 3D semiconductor memory device may include a first gate electrode and a second gate electrode sequentially stacked on a substrate, a vertical channel disposed on the substrate and penetrating the first and second gate electrodes, and a conductive pad disposed in an inner space surrounded by the vertical channel. A bottom surface of the conductive pad may be located at a vertical level between a top surface and a bottom surface of the first gate electrode.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
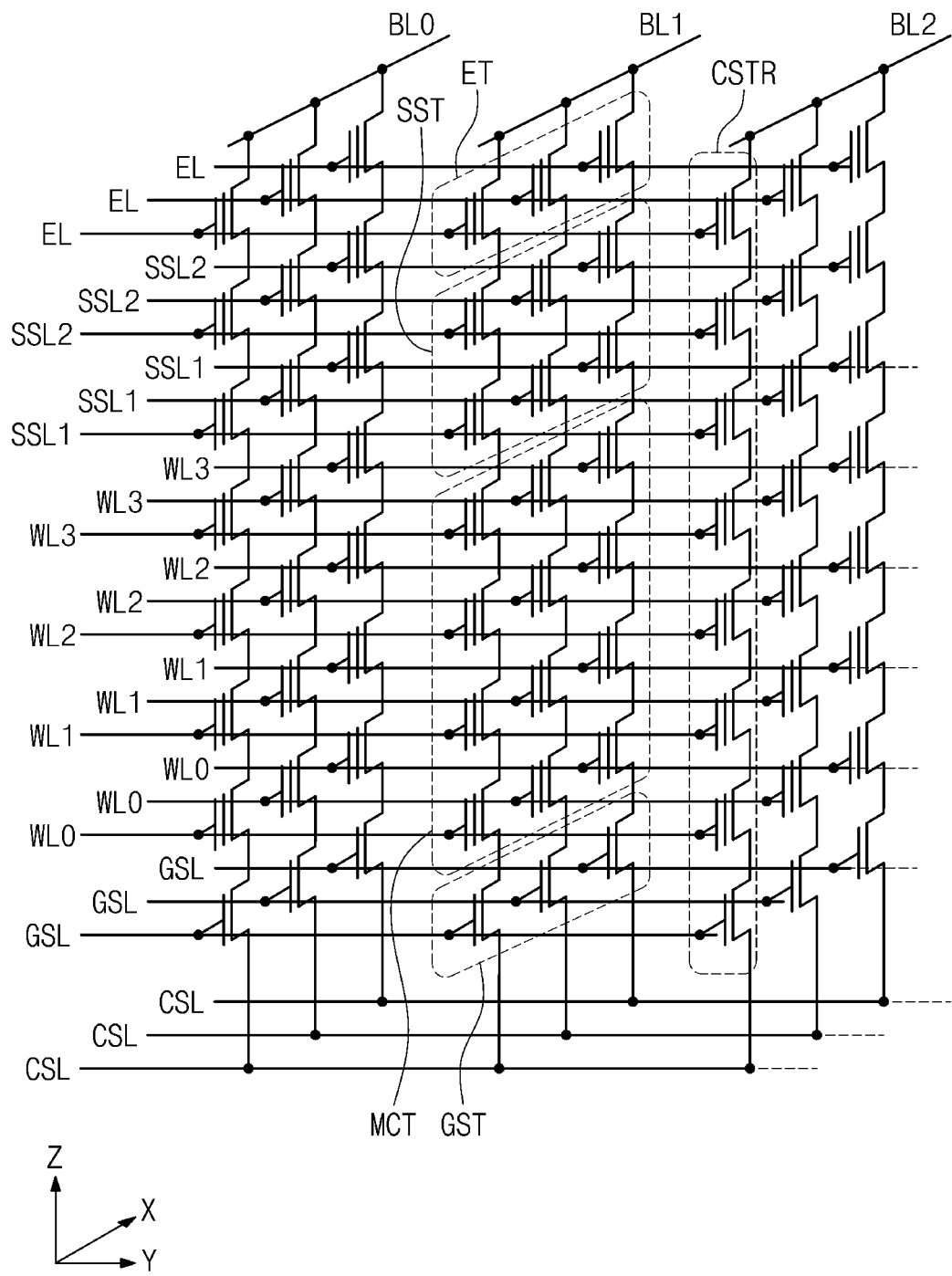
FIG. 1 is a schematic circuit diagram illustrating a cell array of a three-dimensional (3D) semiconductor memory device according to some embodiments of the inventive concepts.

FIG. 1 is a schematic circuit diagram illustrating a cell array of a three-dimensional (3D) semiconductor memory device according to some embodiments of the inventive concepts.

Referring to FIG. 1, a 3D semiconductor memory device may include a common source line CSL, a plurality of bit lines BL0 to BL2, and a plurality of cell strings CSTR provided between the common source line CSL and the bit lines BL0 to BL2.

The common source line CSL may be a conductive layer disposed on a semiconductor substrate or a dopant region formed in the semiconductor substrate. The bit lines BL0 to BL2 may be conductive patterns (e.g., metal lines) vertically spaced apart from the semiconductor substrate. The bit lines BL0 to BL2 may be two-dimensionally arranged and a plurality of the cell strings CSTR may be connected in parallel to each of the bit lines BL0 to BL2. Thus, the cell strings CSTR may be two-dimensionally arranged on the common source line CSL and/or the semiconductor substrate.

Each of the cell strings CSTR may include a ground selection transistor GST connected to the common source line CSL, an erase control transistor ET connected to each of the bit lines BL0 to BL2, one or more string selection transistors SST disposed between the erase control transistor ET and the ground selection transistor GST, and a plurality of memory cell transistors MCT disposed between the ground selection transistor GST and the one or more string selection transistors SST. The ground selection transistor GST, the memory cell transistors MCT, the string selection transistor(s) SST and the erase control transistor ET may be connected in series to each other. As shown in FIG. 1, corresponding ones of a ground selection line GSL, a plurality of word lines WL0 to WL3, string selection lines SSL1 and SSL2 and an erase control line EL may be used as gate electrodes of the ground selection transistor GST, the memory cell transistors MCT, the string selection transistors SST and the erase control transistor ET, respectively.

All or some of the gate electrodes of the memory cell transistors MCT that are disposed at substantially the same level (or distance) from the common source line CSL (e.g., from a level that common source lines CSL are disposed) may be connected in common to one of the word lines WL0 to WL3 so as to be in an equipotential state. In some examples, even though the gate electrodes of the memory cell transistors MCT are disposed at substantially the same level from the common source line CSL (e.g., from the level that the common source lines CSL are disposed), the gate electrodes disposed in one row may be controlled independently of the gate electrodes disposed in another row. For example, all of the gate electrodes connected to the three lines labeled as word line WL1 in FIG. 1 may be connected in common. As another example, each of the three lines WL1 in FIG. 1 may be a separate electrical node such that only the gate electrodes disposed in one row (connected to one of the lines labeled as word line WL1 in FIG. 1) are connected in common. The levels referenced herein may be considered "vertical levels" with respect to a plane parallel to the substrate, e.g., a same level may have the same distance/height from the upper surface of the substrate 100.

The ground selection lines GSL and the string selection lines SSL1 and SSL2 may extend in a second direction Y and may be spaced apart from each other in a first direction X intersecting the second direction Y. The ground selection lines GSL disposed at substantially the same level from the common source line CSL may be electrically isolated from each other (e.g., by an insulator layer), and the string selection lines SSL1 or SSL2 disposed at substantially the same level from the common source line CSL may be electrically isolated from each other (e.g., by an insulator layer). The erase control lines EL disposed at substantially the same level from the common source line CSL (e.g., from the level that the common source lines CSL are disposed) may also be electrically isolated and/or insulated from each other and activated independently from one another. Alternatively, even though not shown in the drawings, the erase control transistors ET connected to different cell strings CSTR may be controlled by a common erase control line EL (e.g., the three lines labeled as a common erase control line EL in FIG. 1 may be connected in common to form a single electrical node). The erase control transistors ET may generate a gate induced drain leakage (GIDL) in an erase operation of the cell array.

[Conditions of Erase Operation of 3D Semiconductor Memory Device]

In the erase operation, a first voltage which is an erase voltage (Vera) may be applied to the bit lines BL0 to BL2, and a second voltage less than the first voltage may be applied to the erase control lines EL. The string selection lines SSL1 and SSL2 and the common source line CSL may be in a floating state in which a voltage is not applied, and the word lines WL0 to WL3 may be in a ground state.

Figure 2:
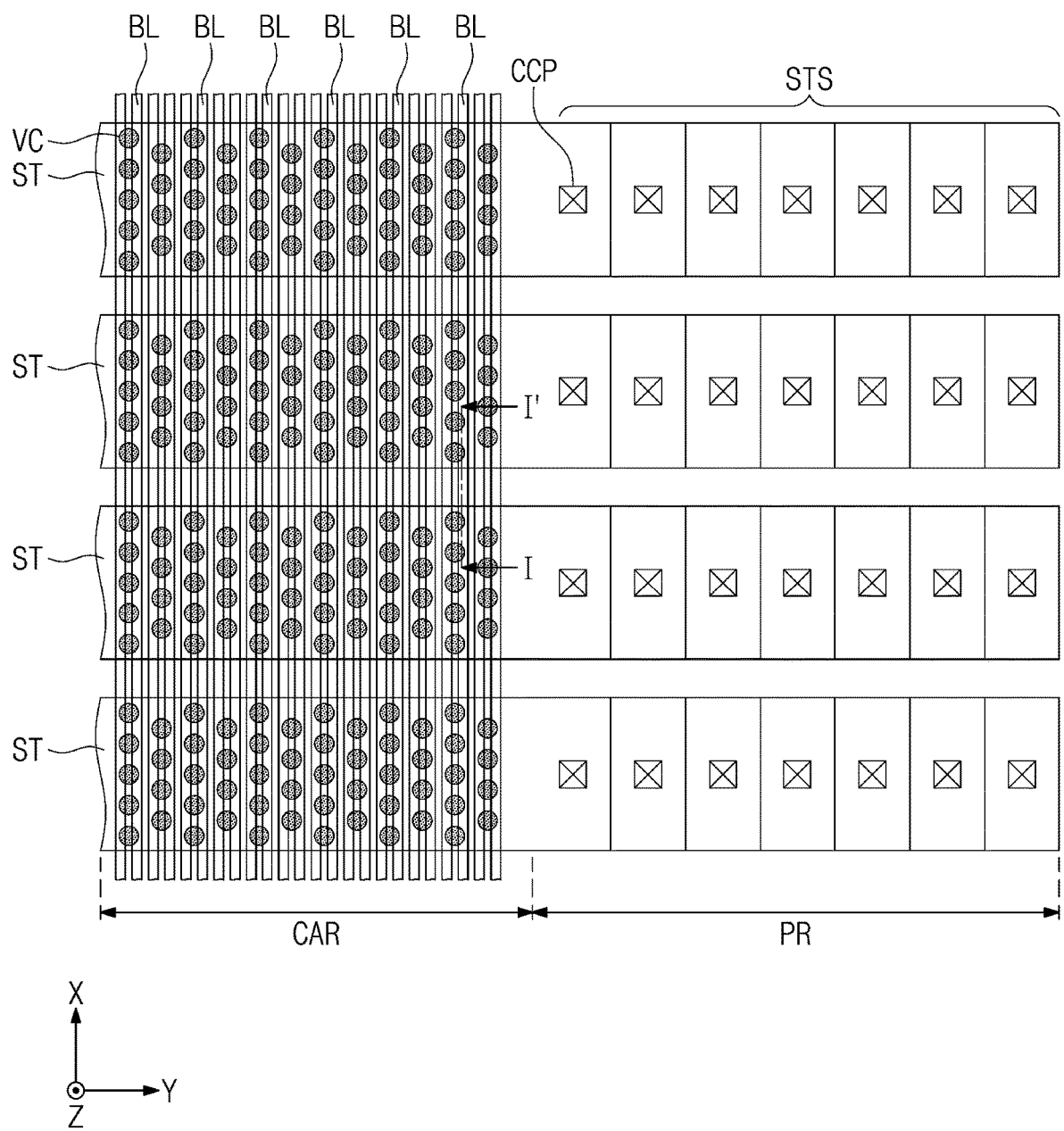
FIG. 2 is a plan view illustrating a 3D semiconductor memory device according to some embodiments of the inventive concepts.
Figure 3:
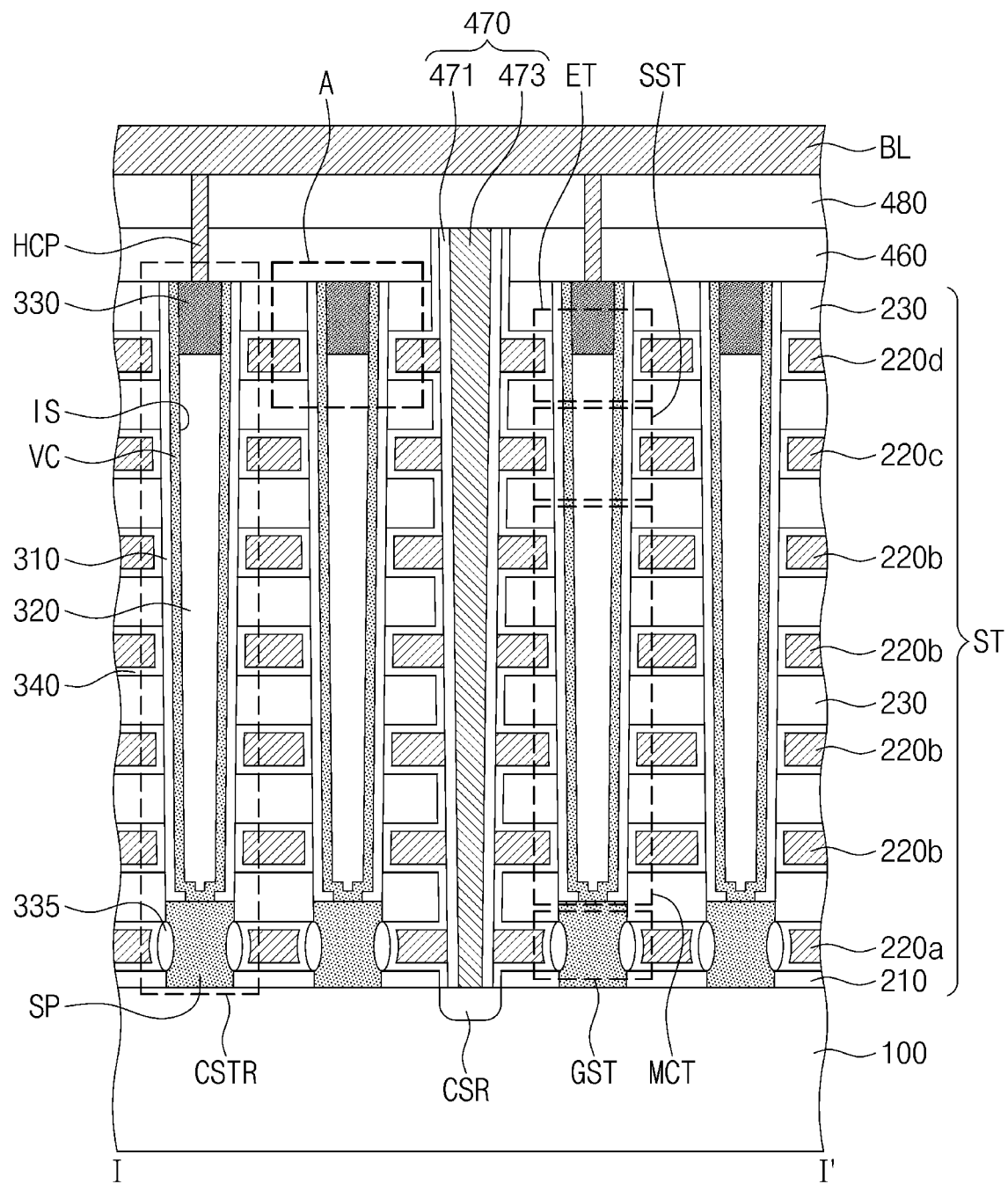
FIG. 3 is a cross-sectional view taken along a line I-I' of FIG. 2 to illustrate a 3D semiconductor memory device according to some embodiments of the inventive concepts.
Figure 4:
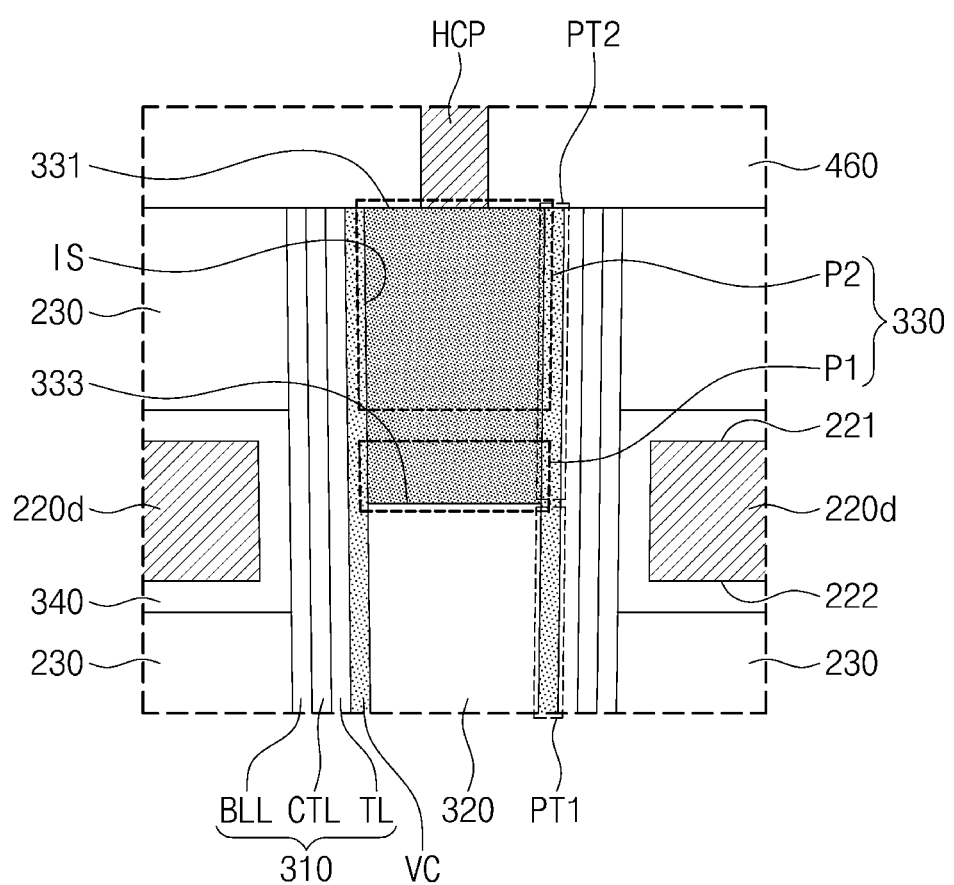
FIG. 4 is an enlarged view of a portion 'A' of FIG. 3.

FIG. 2 is a plan view illustrating a 3D semiconductor memory device according to some embodiments of the inventive concepts. FIG. 3 is a cross-sectional view taken along a line I-I' of FIG. 2 to illustrate a 3D semiconductor memory device according to some embodiments of the inventive concepts. FIG. 4 is an enlarged view of a portion 'A' of FIG. 3. The 3D semiconductor memory device described herein with respect to FIGS. 2, 3 and 4 may have the circuit arrangement as illustrated and described with respect to FIG. 1, although it should be appreciated that the number of ground selection lines GSL, word lines WL, string selection lines SSL and erase lines EL associated with a cell string CSTR (and the corresponding number of transistors of a cell string connected to such lines) may vary (e.g., according to design criteria). For ease of description, each of the cell strings CSTR formed by the structure of FIGS. 2, 3 and 4 corresponds to a structure with one ground selection line GSL (interconnecting and including ground selection gate electrodes 220a), one string selection line SSL (interconnecting and including string selection gate electrodes 220c), one erase line EL (interconnecting and including erase gate electrodes 220d) and four word lines WL (each interconnecting and including those cell gate electrodes 220b illustrated in FIG. 3). It should also be appreciated that while the embodiments show erase control transistors ET and string selection transistors SST including portions of a charge storage structures 310, alternative embodiments may omit this charge storage structure from these transistors.

Referring to FIGS. 2 and 3, stack structures ST may be disposed on a substrate 100. The stack structures ST may be spaced apart from each other in a first direction X on the substrate 100 and may extend in a second direction Y crossing the first direction X. The substrate 100 may include a cell array region CAR and a pad region PR. For example, the substrate 100 may be a silicon substrate, a silicon-germanium substrate, a germanium substrate, or a single-crystalline epitaxial layer grown on a single-crystalline silicon substrate. A common source region CSR may be disposed in the substrate 100 between the stack structures ST, e.g., in a plan view. The common source region CSR may extend linearly in the second direction Y. The common source region CSR may have a different conductivity type from that of the substrate 100. In certain embodiments, the common source region CSR may be formed by implanting an impurity into the substrate 100 so that the common source region CSR may have a different conductivity type from neighboring regions or from the other region of the substrate 100. The upper surface of the common source region CSR may be part of the upper surface of substrate 100 and coplanar with remaining portions of the upper surface of substrate 100. In this embodiment, the common source region CSR may form a common source line CSL which may be the same as the common source line CSL referenced elsewhere herein.

Each of the stack structures ST may include a buffer oxide layer 210, gate electrodes 220a, 220b, 220c and 220d, and insulating patterns 230. The gate electrodes 220a, 220b, 220c and 220d and the insulating patterns 230 may be alternately and repeatedly stacked on the buffer oxide layer 210. The buffer oxide layer 210 may cover a top surface of the substrate 100. For example, the buffer oxide layer 210 may be formed of a thermal oxide layer or a silicon oxide layer. In certain embodiments, the buffer oxide layer 210 may be a thermally oxidized silicon oxide layer. The gate electrodes 220a, 220b, 220c and 220d may include a ground selection gate electrode 220a, cell gate electrodes 220b, a string selection gate electrode 220c, and an erase gate electrode 220d. The ground selection gate electrode 220a may correspond to a lowermost one of the gate electrodes 220a, 220b, 220c and 220d, and the erase gate electrode 220d may correspond to an uppermost one of the gate electrodes 220a, 220b, 220c and 220d. The cell gate electrodes 220b and the string selection gate electrode 220c may be disposed between the ground selection gate electrode 220a and the erase gate electrode 220d. The cell gate electrodes 220b may be disposed between the ground selection gate electrode 220a and the erase gate electrode 220d. The string selection gate electrodes 220c may be disposed between an uppermost cell gate electrode 220b and the erase gate electrode 220d. The gate electrodes 220a, 220b, 220c and 220d may be formed of, for example, doped silicon, a metal (e.g., tungsten), a metal nitride, a metal silicide, or any combination thereof.

The insulating patterns 230 may be disposed between the gate electrodes 220a, 220b, 220c and 220d stacked in a third direction Z perpendicular to the top surface of the substrate 100. An uppermost one of the insulating patterns 230 may be disposed on the erase gate electrode 220d. The insulating patterns 230 may be formed of, for example, silicon oxide. Each of the stack structures ST may have a stepped structure STS on the pad region PR of the substrate 100. For example, a height of each of the stack structures ST on the pad region PR may decrease as a horizontal distance from the cell array region CAR increases. For example, lengths of the gate electrodes 220a, 220b, 220c and 200d in the second direction Y may sequentially decrease as a vertical distance from the substrate 100 increases. In some embodiments, the gate electrodes 220a, 220b, 200c and 220d may have end portions on the pad region PR of the substrate 100. The end portion of each of the ground selection, cell and string selection gate electrodes 220a, 220b and 220c may be exposed by the gate electrode 220b, 220c or 220d disposed directly on each of the ground selection, cell and string selection gate electrodes 220a, 220b and 220c. The end portion of the erase gate electrode 220d may be a portion of the erase gate electrode 220d disposed on the pad region PR.

Vertical channel portions VC may penetrate the stack structures ST. For example, the vertical channel portions VC may extend in the third direction Z on the cell array region CAR of the substrate 100 to penetrate the stack structures ST. The vertical channel portions VC may be arranged in a zigzag form or a line (i.e., a straight line) in the first direction X and/or in the second direction Y in a plan view. Each of the vertical channel portions VC may have a hollow pipe shape, a hollow cylindrical shape, or a cup shape. The vertical channel portions VC may be connected to the substrate 100. Each of the vertical channel portions VC may be formed of a single layer or a plurality of layers. For example, each of the vertical channel portions VC may be formed of a single-crystalline silicon layer, an organic semiconductor layer, or a carbon nano-structure. For example the vertical channel portions VC may form vertical channels of transistors included in corresponding cell strings CSTR. For example, a vertical channel may correspond a plurality of transistor channels.

Semiconductor pillars SP may be disposed between the substrate 100 and the vertical channel portions VC, respectively. The semiconductor pillars SP may be disposed on the top surface of the substrate 100 and may penetrate the ground selection gate electrode 220a. The semiconductor pillars SP may be in contact with the vertical channel portions VC, respectively. The semiconductor pillars SP may include a semiconductor material having the same conductivity type as the substrate 100 or may include an intrinsic semiconductor material. Charge storage structures 310 may be disposed between the vertical channel portions VC and the gate electrodes 220a, 220b, 220c and 200d. Each of charge storage structures 310 may extend in the third direction Z along outer sidewalls of the vertical channel portions VC. For example, each of the charge storage structures 310 may be formed as a tube and may surround the outer sidewalls of the vertical channel portions VC, respectively. For example, each of the charge storage structures 310 may be formed as a single layer or as a multi-layer structure with one or more of a silicon oxide layer, a silicon nitride layer, a silicon oxynitride layer, and a high-k dielectric layer.

Referring to FIGS. 2, 3 and 4, each of the charge storage structures 310 may include a tunnel insulating layer TL, a blocking insulating layer BLL, and a charge storage layer CTL. The tunnel insulating layer TL may be adjacent to each of the vertical channel portions VC and may surround the outer sidewall of the vertical channel portion VC. The blocking insulating layer BLL may be adjacent to the gate electrodes 220a, 220b, 220c and 220d. The charge storage layer CTL may be disposed between the tunnel insulating layer TL and the blocking insulating layer BLL. For example, the tunnel insulating layer TL may include a silicon oxide layer and/or a high-k dielectric layer (e.g., aluminum oxide ($Al_2O_3$) or hafnium oxide ($HfO_2$)). For example, the blocking insulating layer BLL may be a silicon oxide layer and/or a high-k dielectric layer (e.g., aluminum oxide ($Al_2O_3$) or hafnium oxide ($HfO_2$)). For example, the charge storage layer CTL may be a silicon nitride layer. Gap-fill layers 320 may be disposed in inner spaces IS surrounded by the vertical channel portions VC, respectively. For example, each of the gap-fill layers 320 may be formed of at least one of a silicon oxide layer, a silicon nitride layer, and a silicon oxynitride layer.

Referring to FIGS. 2, 3 and 4, pads 330 may be disposed in the inner spaces IS surrounded by the vertical channel portions VC, respectively. The pads 330 may be disposed on top surfaces of the gap-fill layers 320, respectively. The pads 330 may horizontally overlap with the erase gate electrode 220d. In some embodiments, each of the pads 330 may include a first portion P1 and a second portion P2. The first portion P1 may horizontally overlap with a portion of the erase gate electrode 220d. The second portion P2 may horizontally overlap with a whole of the uppermost insulating pattern 230. For example, the height or thickness of each of the pads 330 in the third direction Z may be greater than the thickness or height of the uppermost insulating pattern 230 formed on an adjacent erase gate electrode 220d. Top surfaces 331 of the pads 330 may be located at substantially the same level as and coplanar with top surfaces of the stack structures ST and top surfaces of the vertical channel portions VC. Bottom surfaces 333 of the pads 330 may be disposed at a level between a top surface 221 and a bottom surface 222 of the erase gate electrode 220d. For example, the bottom surfaces 333 of the pads 330 may be located at a higher level than a top surface of the string selection gate electrode 220c. The pads 330 may include a conductive material or a semiconductor material doped with dopants. In some embodiments, each of the vertical channel portions VC may include a first portion PT1 disposed between the gap-fill layer 320 and the stack structure ST and a second portion PT2 disposed between the pad 330 and the stack structure ST. The first portion PT1 and the second portion PT2 of the vertical channel portion VC may not include charge carrier dopants such as P-type dopants and N-type dopants. The first portion PT1 and the second portion PT2 of the vertical channel portion VC may be an intrinsic semiconductor material.

As described above with reference to FIG. 1, in the erase operation, the first voltage corresponding to the erase voltage may be applied to bit lines BL, and the second voltage less than the first voltage may be applied to the erase gate electrode 220d. The gate induced drain leakage (GIDL) may occur in an erase control transistor ET including the erase gate electrode 220d due to a potential difference (or a voltage) between the pad 330 and the erase gate electrode 220d (resulting from the different voltages applied to the pad 330 and erase gate electrode 220d). According to the embodiments of the inventive concepts, the pads 330 may horizontally overlap with the erase gate electrode 220d (e.g., have portions at the same vertical level—e.g., portions shown as intersecting a line extending in the X direction in FIGS. 3 and 4), and thus the GIDL phenomenon may be easily induced between the erase gate electrode 220d and the pads 330. Electron-hole pairs may be generated in the vertical channel portion VC disposed between the pad 330 and the erase gate electrode 220d as a result of the GIDL phenomenon. The electrons may move to the pad 330, and the holes may be supplied into the vertical channel portion VC. Thus, the holes may be smoothly provided from the vertical channel portion VC into the charge storage layer CTL in the erase operation. The holes may be provided from the vertical channel portion VC into the charge storage layer CTL of the entire cell string CSTR (see FIG. 1) in the erase operation (i.e., portions adjacent all of the memory cell transistors MCT of the cell string CSTR being subject to the erase operation) to reduce negative charge (i.e., electrons) from the charge storage portions of these memory cell transistors MCT. As a result, the erase operation of the 3D semiconductor memory device may be performed well.

A gate insulating layer 335 may be disposed between the semiconductor pillar SP and the ground selection gate electrode 220a. Sidewalls of the gate insulating layer 335 may have curved surfaces which are convex in opposite directions to each other. For example, the gate insulating layer 335 may include a thermal oxide layer, e.g., a silicon oxide layer. A horizontal insulating layer 340 may be disposed between the charge storage structure 310 and the gate electrodes 220a, 220b, 220c and 220d and may extend onto top surfaces and bottom surfaces of the gate electrodes 220a, 220b, 220c and 220d. For example, the horizontal insulating layer 340 may include a silicon oxide ($SiO_2$) layer and/or a high-k dielectric layer (e.g., aluminum oxide ($Al_2O_3$) or hafnium oxide ($HfO_2$)).

A first interlayer insulating layer 460 may be disposed on the stack structures ST. The first interlayer insulating layer 460 may cover a top surface of the uppermost insulating pattern 230 and the top surfaces 331 of the pads 330. For example, the first interlayer insulating layer 460 may include a silicon oxide layer.

Contact structures 470 may be disposed between the stack structures ST. The contact structures 470 may extend in the second direction Y and may penetrate the first interlayer insulating layer 460. Each of the contact structures 470 may have a rectangular or linear shape extending in the second direction Y when viewed from a plan view. Alternatively, the contact structures 470 may be arranged in the second direction Y along the common source region CSR. In this case, the contact structures 470 may have pillar shapes. Each of the contact structures 470 may include a spacer 471 and a common source contact 473. The common source contact 473 may be electrically connected to the common source region CSR. For example, the common source contact 473 may include at least one of a metal material (e.g., tungsten, copper, or aluminum) and a transition metal material (e.g., titanium or tantalum). The spacer 471 may surround a sidewall of the common source contact 473. For example, the spacer 471 may include an insulating material (e.g., a silicon oxide layer or a silicon nitride layer).

A second interlayer insulating layer 480 may be disposed on the first interlayer insulating layer 460. The second interlayer insulating layer 480 may cover top surfaces of the contact structures 470 and a top surface of the first interlayer insulating layer 460. For example, the second interlayer insulating layer 480 may include a silicon oxide layer. Channel contact plugs HCP may be disposed on the pads 330, respectively. The channel contact plugs HCP may penetrate the second and first interlayer insulating layers 480 and 460 and may be in contact (i.e., directly connected) with the pads 330. For example, the channel contact plugs HCP may be formed of at least one of a metal material (e.g., copper or tungsten) and a metal nitride (e.g., TiN, TaN, or WN). Cell contact plugs CCP may be disposed on the pad region PR of the substrate 100. The cell contact plugs CCP may penetrate the second and first interlayer insulating layers 480 and 460 and may be disposed on the end portions of the gate electrodes 220a, 220b, 220c and 220d, respectively. The cell contact plugs CCP may be in contact with top surfaces of the end portions of the gate electrodes 220a, 220b, 220c and 220d. The cell contact plugs CCP may be formed of at least one of a metal material (e.g., copper or tungsten) and a metal nitride (e.g., TiN, TaN, or WN).

Bit lines BL may be disposed on the second interlayer insulating layer 480. The bit lines BL may extend in the first direction X to intersect the stack structures ST, e.g., in a plan view. For example, each of the bit lines BL may extend over a plurality of stack structures ST. The bit lines BL may be spaced apart from each other in the second direction Y on the second interlayer insulating layer 480. Each of the bit lines BL may be electrically connected to the vertical channel portions VC arranged in the first direction X. For example, the bit lines BL may be formed of a metal material (e.g., tungsten or aluminum).

Figure 5:
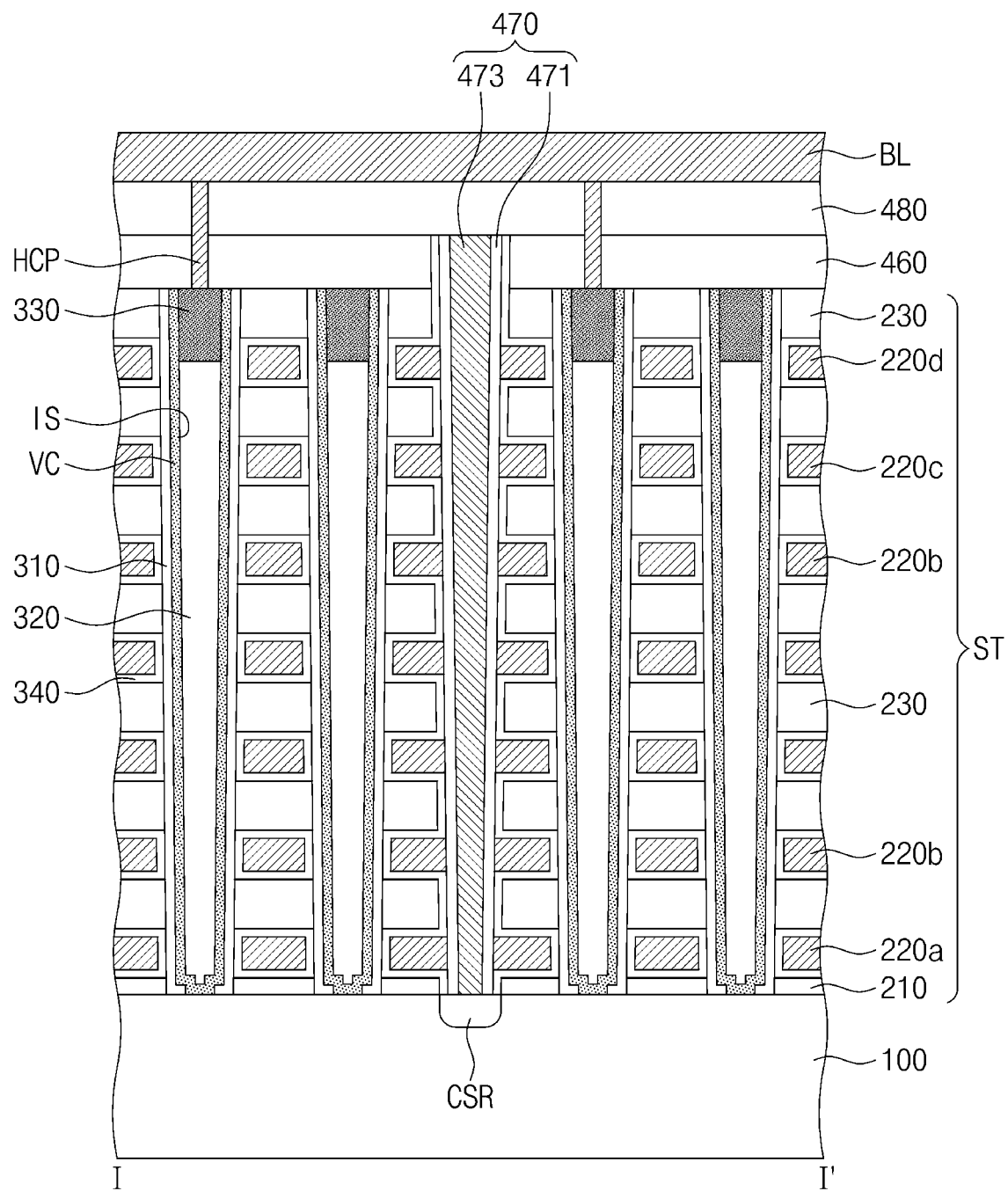
FIG. 5 is a cross-sectional view taken along the line I-I' of FIG. 2 to illustrate a 3D semiconductor memory device according to some embodiments of the inventive concepts.

FIG. 5 is a cross-sectional view taken along the line I-I' of FIG. 2 to illustrate a 3D semiconductor memory device according to some embodiments of the inventive concepts. Hereinafter, the same elements or components as the ones illustrated and/or described in the above embodiments will be indicated by the same reference numerals or the same reference designators, and the descriptions thereof will be omitted or mentioned briefly for the purpose of ease and convenience in explanation.

Referring to FIG. 5, the vertical channel portions VC and the charge storage structures 310 may extend further to penetrate the ground selection gate electrode 220a and the buffer oxide layer 210 and may be in contact with the substrate 100. Ground select transistors GST may include a charge storage element (a corresponding portion of a corresponding charge storage structure 310). For example, in the present embodiment, the semiconductor pillars SP and the gate insulating layers 335 of FIG. 3 may be omitted.

Figure 6:
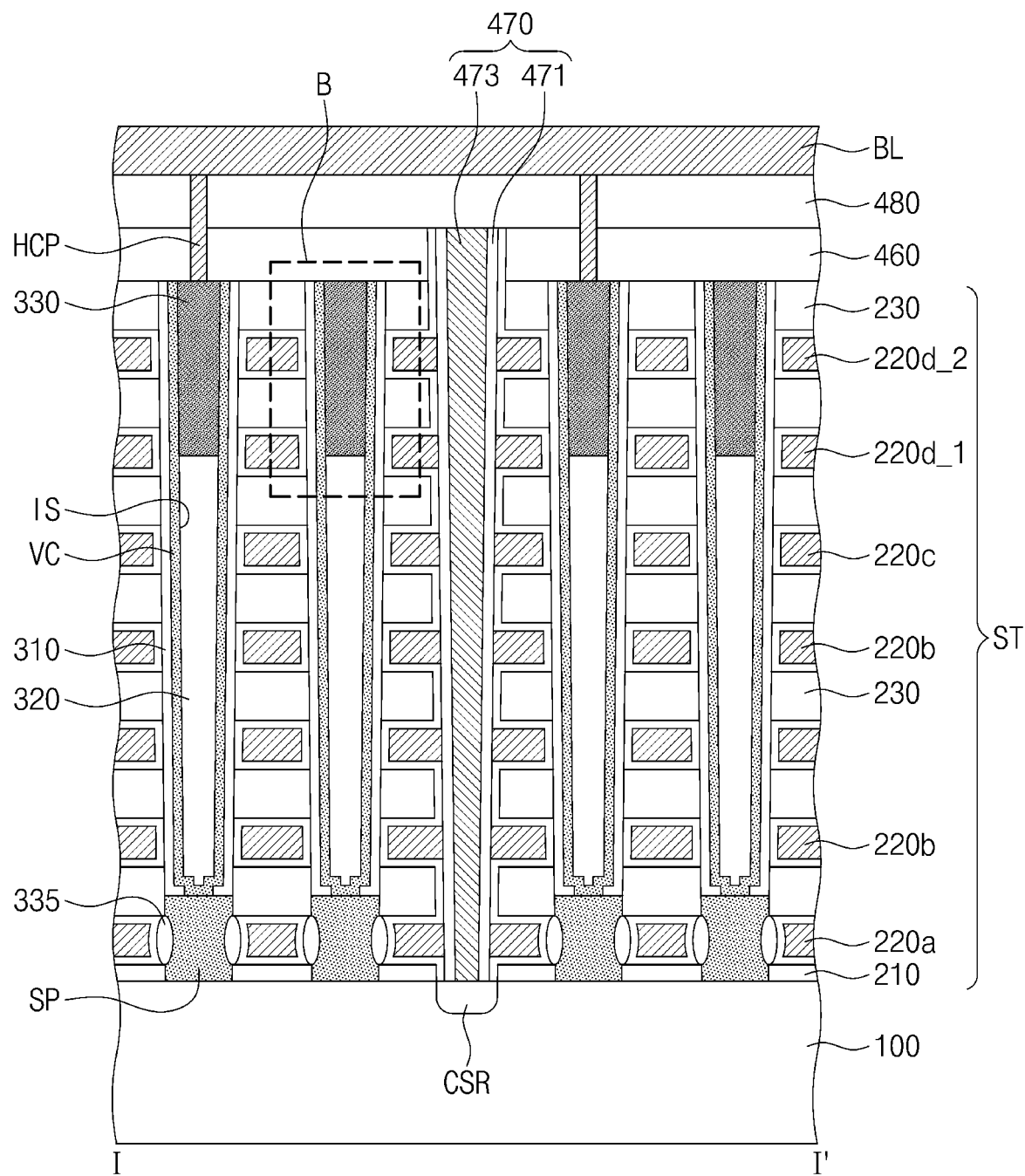
FIG. 6 is a cross-sectional view taken along the line I-I' of FIG. 2 to illustrate a 3D semiconductor memory device according to some embodiments of the inventive concepts.
Figure 7:
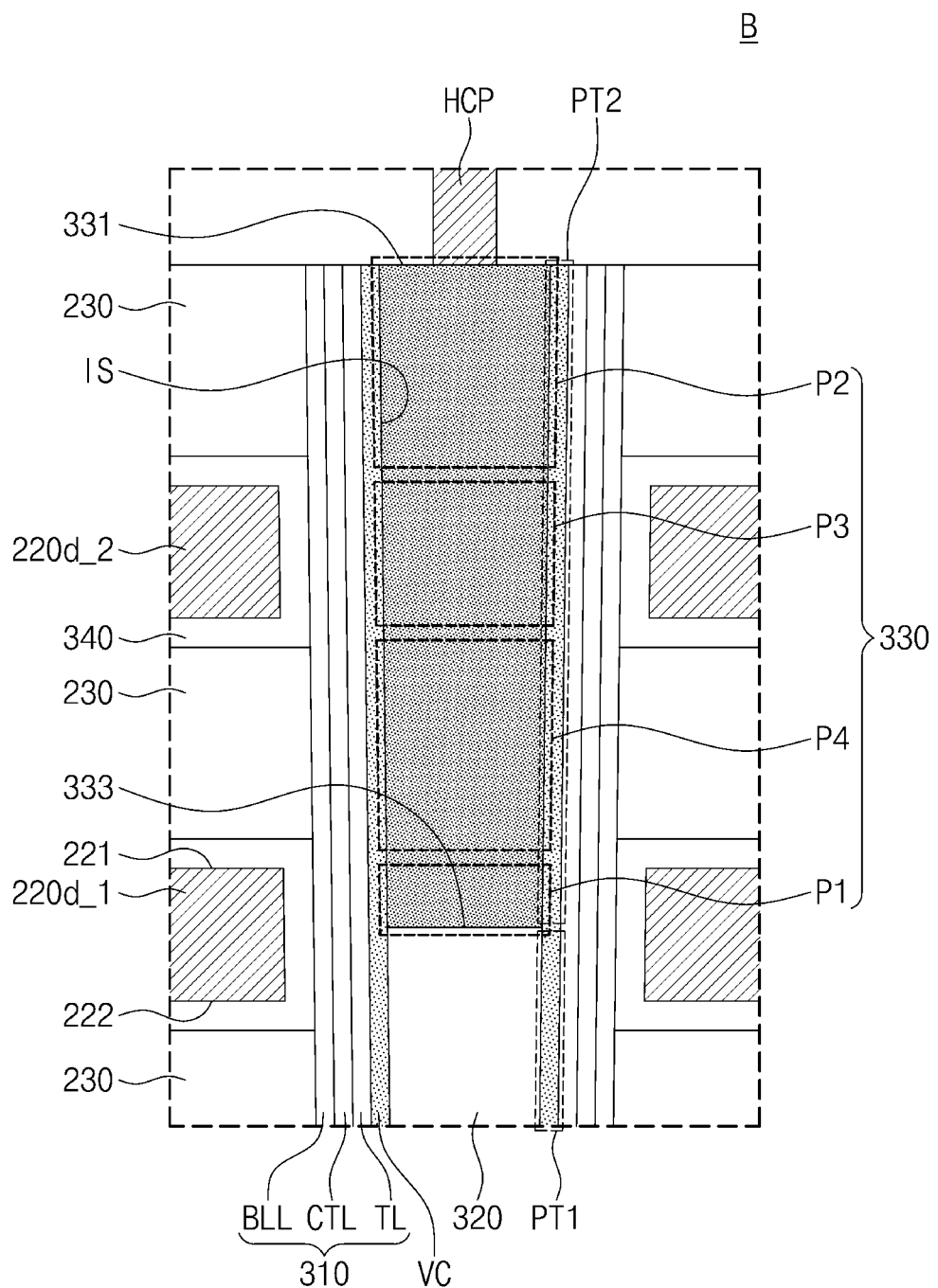
FIG. 7 is an enlarged view of a portion 'B' of FIG. 6.

FIG. 6 is a cross-sectional view taken along the line I-I' of FIG. 2 to illustrate a 3D semiconductor memory device according to some embodiments of the inventive concepts. FIG. 7 is an enlarged view of a portion 'B' of FIG. 6. Hereinafter, the same elements or components as the ones illustrated and/or described in the above embodiments will be indicated by the same reference numerals or the same reference designators, and the descriptions thereof will be omitted or mentioned briefly for the purpose of ease and convenience in explanation.

Referring to FIGS. 6 and 7, each of stack structures ST may include gate electrodes 220a, 220b, 220c, 220d_1 and 220d_2. In some embodiments, a first erase gate electrode 220d_1 and a second erase gate electrode 220d_2 may be sequentially stacked on the string selection gate electrode

220c. For example, two or more erase gate electrodes 220d_1 and 220d_2 may be provided in a 3D semiconductor memory device according to some embodiments of the inventive concepts. The first and second erase gate electrodes 220d_1 and 220d_2 may include the same material as the ground selection, cell and string selection gate electrodes 220a, 220b and 220c.

Pads 330 may be disposed in the inner spaces IS surrounded by the vertical channel portions VC, respectively. The pads 330 may horizontally overlap with the first erase gate electrode 220d_1 and the second erase gate electrode 220d_2. For example, each of the pads 330 may include a first portion P1, a second portion P2, a third portion P3, and a fourth portion P4. The first portion P1 may horizontally overlap with a portion of the first erase gate electrode 220d_1, and the second portion P2 may horizontally overlap with a whole of the uppermost insulating pattern 230. The third portion P3 may horizontally overlap with a whole of the second erase gate electrode 220d_2, and the fourth portion P4 may horizontally overlap with a whole of the insulating pattern 230 disposed between the first and second erase gate electrodes 220d_1 and 220d_2. A top surface 331 of the pad 330 may be located at substantially the same level as the top surface of the stack structure ST, and a bottom surface 333 of the pad 330 may be located at a level between a top surface 221 and a bottom surface 222 of the first erase gate electrode 220d_1.

In some embodiments, the first portion PT1 and the second portion PT2 of the vertical channel portion VC may not include dopants such as P-type dopants and N-type dopants. For example, the first and second portions PT1 and PT2 of the vertical channel portion VC may be formed of an intrinsic semiconductor material.

Figure 8:
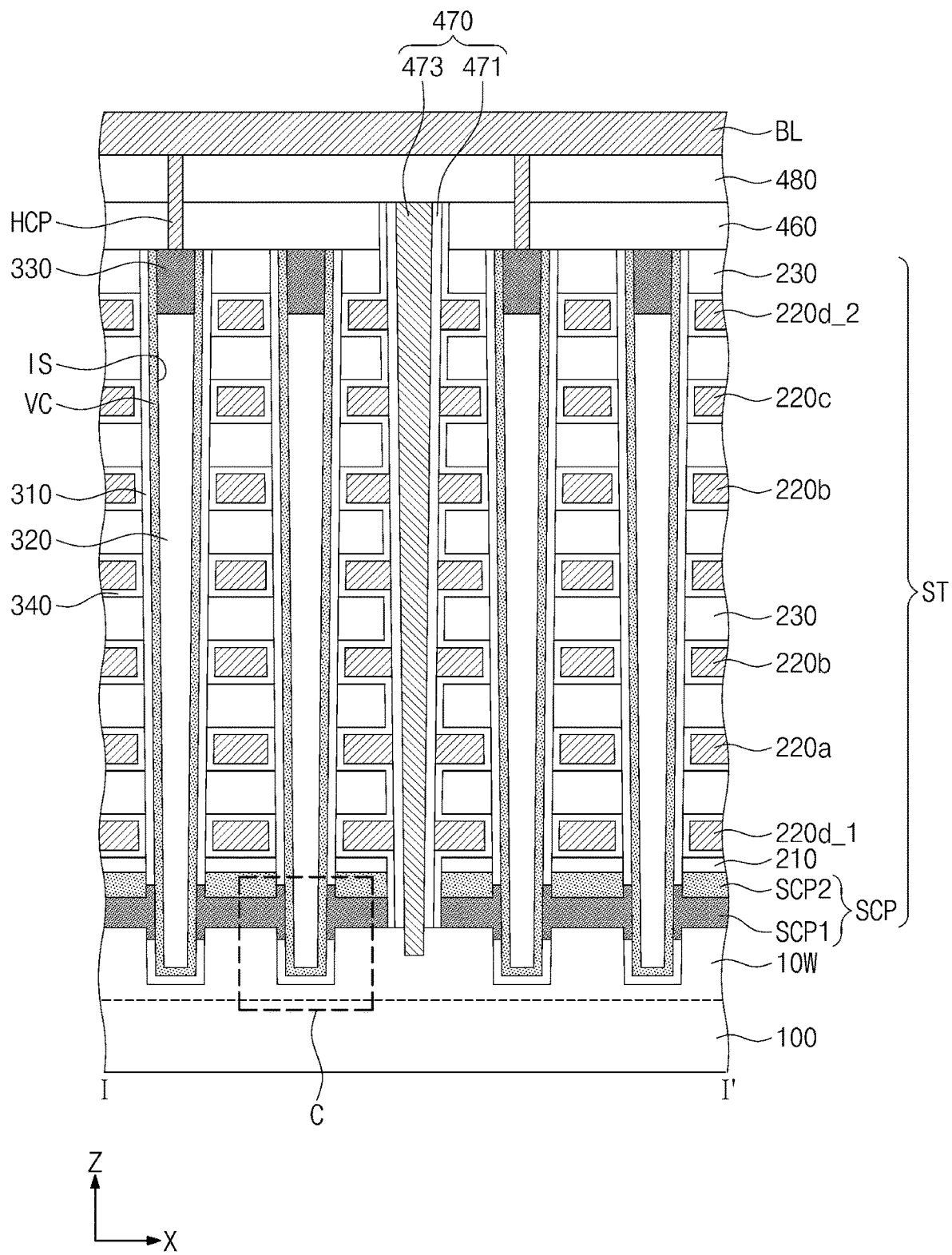
FIG. 8 is a cross-sectional view taken along the line I-I' of FIG. 2 to illustrate a 3D semiconductor memory device according to some embodiments of the inventive concepts.
Figure 9:
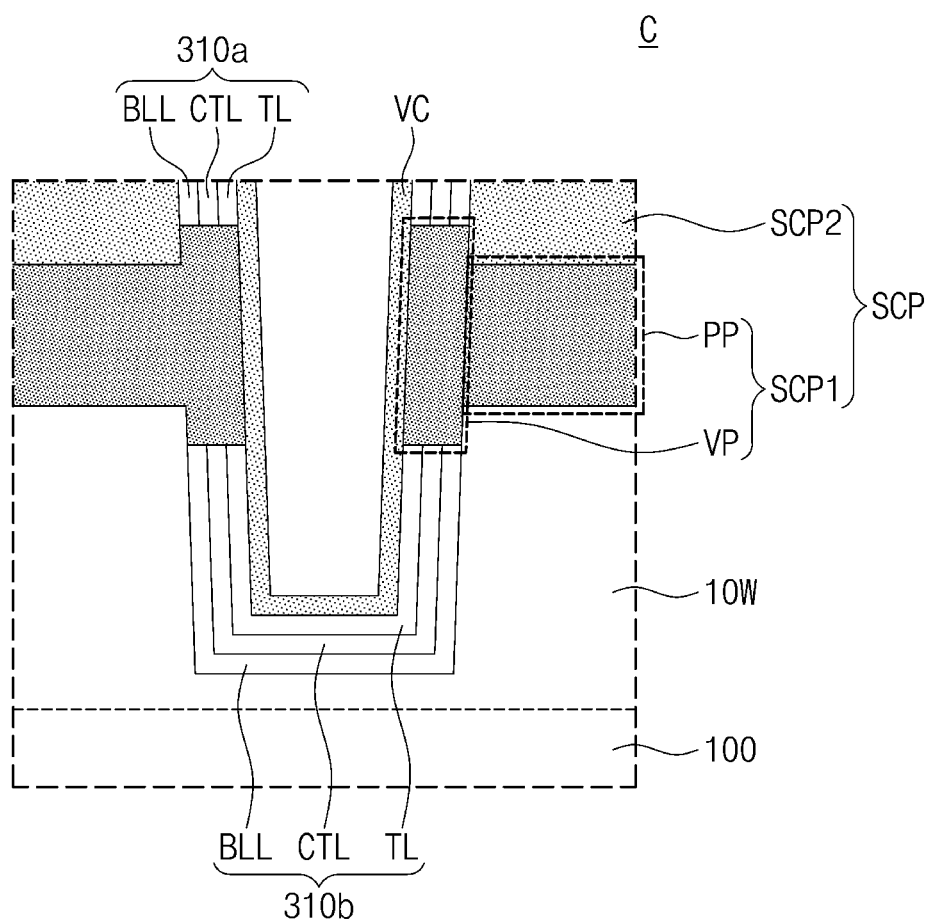
FIG. 9 is an enlarged view of a portion 'C' of FIG. 8.

FIG. 8 is a cross-sectional view taken along the line I-I' of FIG. 2 to illustrate a 3D semiconductor memory device according to some embodiments of the inventive concepts. FIG. 9 is an enlarged view of a portion 'C' of FIG. 8. Hereinafter, the same elements or components as the ones illustrated and/or described in the above embodiments will be indicated by the same reference numerals or the same reference designators, and the descriptions thereof will be omitted or mentioned briefly for the purpose of ease and convenience in explanation.

Referring to FIGS. 8 and 9, a well dopant region 10W may be provided in the substrate 100. The well dopant region 10W may include dopants which has a conductivity type opposite to that of the substrate 100. For example, the well dopant region 10W may include phosphorus (P) or arsenic (As).

Each of stack structures ST may include a source conductive pattern SCP, a buffer oxide layer 210 on the source conductive pattern SCP, gate electrodes 220d_1, 220a, 220b, 220c and 220d_2, and insulating patterns 230. The gate electrodes 220d_1, 220a, 220b, 220c and 220d_2 and the insulating patterns 230 may be alternately and repeatedly stacked on the buffer oxide layer 210. The source conductive pattern SCP may correspond to a lowermost layer of the stack structure ST. A first erase gate electrode 220d_1 may correspond to a lowermost one of the gate electrodes 220d_1, 220a, 220b, 220c and 220d_2, and a second erase gate electrode 220d_2 may correspond to an uppermost one of the gate electrodes 220d_1, 220a, 220b, 220c and 220d_2. The ground selection gate electrode 220a may be disposed on the first erase gate electrode 220d_1, e.g., between the first erase gate electrode 220d_1 and the cell gate electrodes 220b, and the cell gate electrodes 220b may be disposed between the ground selection gate electrode 220a and the second erase gate electrode 220d_2. The string selection gate electrodes 220c may be disposed between the uppermost cell gate electrode 220b and the second erase gate electrode 220d_2.

A charge storage structure 310 may surround an outer sidewall of the vertical channel portion VC and may be disposed between a bottom surface of the vertical channel portion VC and the substrate 100. For example, the vertical channel portion VC may be spaced apart from the substrate 100. Lower portions of the vertical channel portions VC and lower portions of the charge storage structures 310 may be disposed in the well dopant region 10W of the substrate 100. For example, the bottom surfaces of the vertical channel portions VC and bottom surfaces of the charge storage structures 310 may be located at a lower level than the top surface of the substrate 100. For example, the well dopant region 10W may be included in the substrate 100, and the bottom surfaces of the vertical channel portions VC and bottom surfaces of the charge storage structures 310 may be disposed lower than the top surface of the well dopant region 10W.

The source conductive pattern SCP may be disposed between the substrate 100 and the buffer oxide layer 210. The source conductive pattern SCP may include a first source conductive pattern SCP1 and a second source conductive pattern SCP2. The second source conductive pattern SCP2 may be disposed on a top surface of the first source conductive pattern SCP1. For example, the first source conductive pattern SCP1 may extend from between the substrate 100 (e.g., the dopant well 10W) and the second source conductive pattern SCP2 to between the second source conductive pattern SCP2 and the vertical channel portion VC and into between the substrate 100 (e.g., the dopant well 10W) and the vertical channel portion VC. The charge storage structure 310 may be divided into an upper charge storage structure 310a and a lower charge storage structure 310b by the first source conductive pattern SCP1. The upper charge storage structure 310a may be disposed on the first source conductive pattern SCP1, and the lower charge storage structure 310b may be disposed under the first source conductive pattern SCP1. For example, the lower charge storage structure 310b may be formed in the dopant well 10W, and the upper charge storage structure 310a may be formed between the first source conductive pattern SCP1 and the first interlayer insulating layer 460.

For example, the first source conductive pattern SCP1 may include a horizontal portion PP and a vertical portion VP. The horizontal portion PP of the first source conductive pattern SCP1 may be disposed between the substrate 100 (e.g., the dopant well 10W) and the second source conductive pattern SCP2. The vertical portion VP may extend from between the vertical channel portion VC and the horizontal portion PP into between the second source conductive pattern SCP2 and the vertical channel portion VC and into between the substrate 100 (e.g., the dopant well 10W) and the vertical channel portion VC. The vertical portion VP may be in contact with the charge storage structure 310, e.g., at its both ends of the vertical portion VP in a cross-sectional view. A top surface of the vertical portion VP may be located at a level between a top surface of the horizontal portion PP and a top surface of the second source conductive pattern SCP2. A bottom surface of the vertical portion VP may be located at a lower level than the top surface of the substrate 100 (e.g., the top surface of the dopant well 10W). For example, the levels herein may refer to different levels in the third direction Z. The first source conductive pattern SCP1 may be in contact with the well dopant region 10W of the substrate 100, the second source conductive pattern SCP2, and the vertical channel portion VC. In some embodiments, the first and second source conductive patterns SCP1 and SCP2 may be formed of poly-silicon doped with N-type dopants, and a dopant concentration of the second source conductive pattern SCP2 may be higher than a dopant concentration of the first source conductive pattern SCP1.

In the present embodiment, the common source region CSR of FIG. 3 may be omitted. For example, the source conductive pattern SCP of the present embodiment may form a common source line CSL referenced elsewhere and/or other embodiments herein.

FIGS. 10 to 13 are cross-sectional views taken along the line I-I' of FIG. 2 to illustrate a method of manufacturing a 3D semiconductor memory device according to some embodiments of the inventive concepts.

Figure 10:
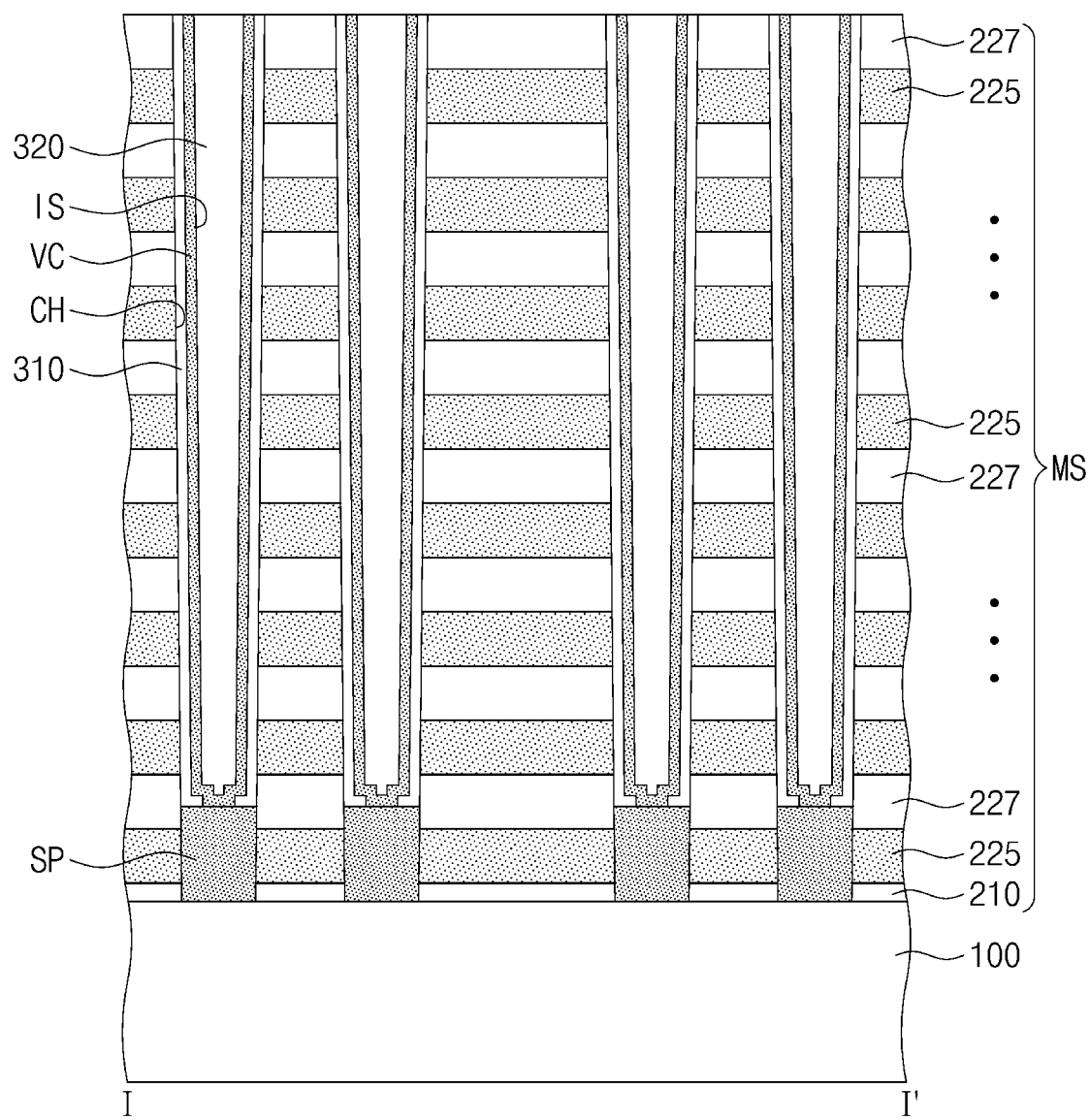
FIGS. 10 to 13 are cross-sectional views taken along the line I-I' of FIG. 2 to illustrate a method of manufacturing a 3D semiconductor memory device according to some embodiments of the inventive concepts.

Referring to FIG. 10, a mold structure MS may be formed on a substrate 100. The formation of the mold structure MS may include forming a buffer oxide layer 210 on the substrate 100, and alternately and repeatedly stacking sacrificial layers 225 and insulating layers 227 on the buffer oxide layer 210. For example, the buffer oxide layer 210 may include a thermal oxide layer or a silicon oxide layer. In certain embodiments, the buffer oxide layer 210 may be a thermally oxidized silicon oxide layer. For example, each of the sacrificial layers 225 may include a silicon nitride layer. The insulating layers 227 may be formed of a material having an etch selectivity with respect to the sacrificial layers 225. Each of the insulating layers 227 may include, for example, a silicon oxide layer.

Channel holes CH may be formed by patterning the mold structure MS. The channel holes CH may penetrate the mold structure MS on the cell array region CAR of the substrate 100. For example, the formation of the channel holes CH may include forming a mask pattern (not shown) on the mold structure MS, and anisotropically etching the mold structure MS using the mask pattern as an etch mask. A top surface of the substrate 100 exposed through the channel holes CH may be recessed by over-etching. Each of the channel holes CH may have a circular shape, an elliptical shape, or a polygonal shape in a plan view.

Semiconductor pillars SP may be formed in the channel holes CH, respectively. The semiconductor pillars SP may be grown from the substrate 100 by performing a selective epitaxial growth (SEG) process using the substrate 100, exposed through the channel holes CH, as a seed. Charge storage structures 310 may be formed on sidewalls of the channel holes CH. The charge storage structures 310 may cover the sidewalls of the channel holes CH and may cover portions of top surfaces of the semiconductor pillars SP exposed by the channel holes CH. Referring to FIGS. 4 and 10, each of the charge storage structures 310 may include a blocking insulating layer BLL, a charge storage layer CTL, and a tunnel insulating layer TL, which are sequentially formed on the sidewall of each of the channel holes CH. For example, the blocking insulating layer BLL may include a silicon oxide layer or a high-k dielectric layer (e.g., $Al_2O_3$ or $HfO_2$), the charge storage layer CTL may include a silicon nitride layer, and the tunnel insulating layer TL may include a silicon oxide layer or a high-k dielectric layer (e.g., $Al_2O_3$ or $HfO_2$).

Vertical channel portions VC may be formed in the channel holes CH, respectively. Each of the vertical channel portions VC may conformally cover an inner sidewall of the charge storage structure 310 and the top surface of the semiconductor pillar SP exposed by the charge storage structure 310. The vertical channel portions VC may be thermally treated by a hydrogen annealing process performed in a gas atmosphere including hydrogen or heavy hydrogen. For example, the heavy hydrogen included in the gas may include deuterium, tritium or a hydrogen isotope including four or more neutrons. Crystal defects existing in the vertical channel portions VC may be cured by the hydrogen annealing process.

Gap-fill layers 320 may be formed in inner spaces IS surrounded by the vertical channel portions VC, respectively. The gap-fill layers 320 may completely fill the inner spaces IS. The gap-fill layers 320 may be formed using a spin-on-glass (SOG) technique. The gap-fill layers 320 may include an insulating material (e.g., silicon oxide).

Figure 11:
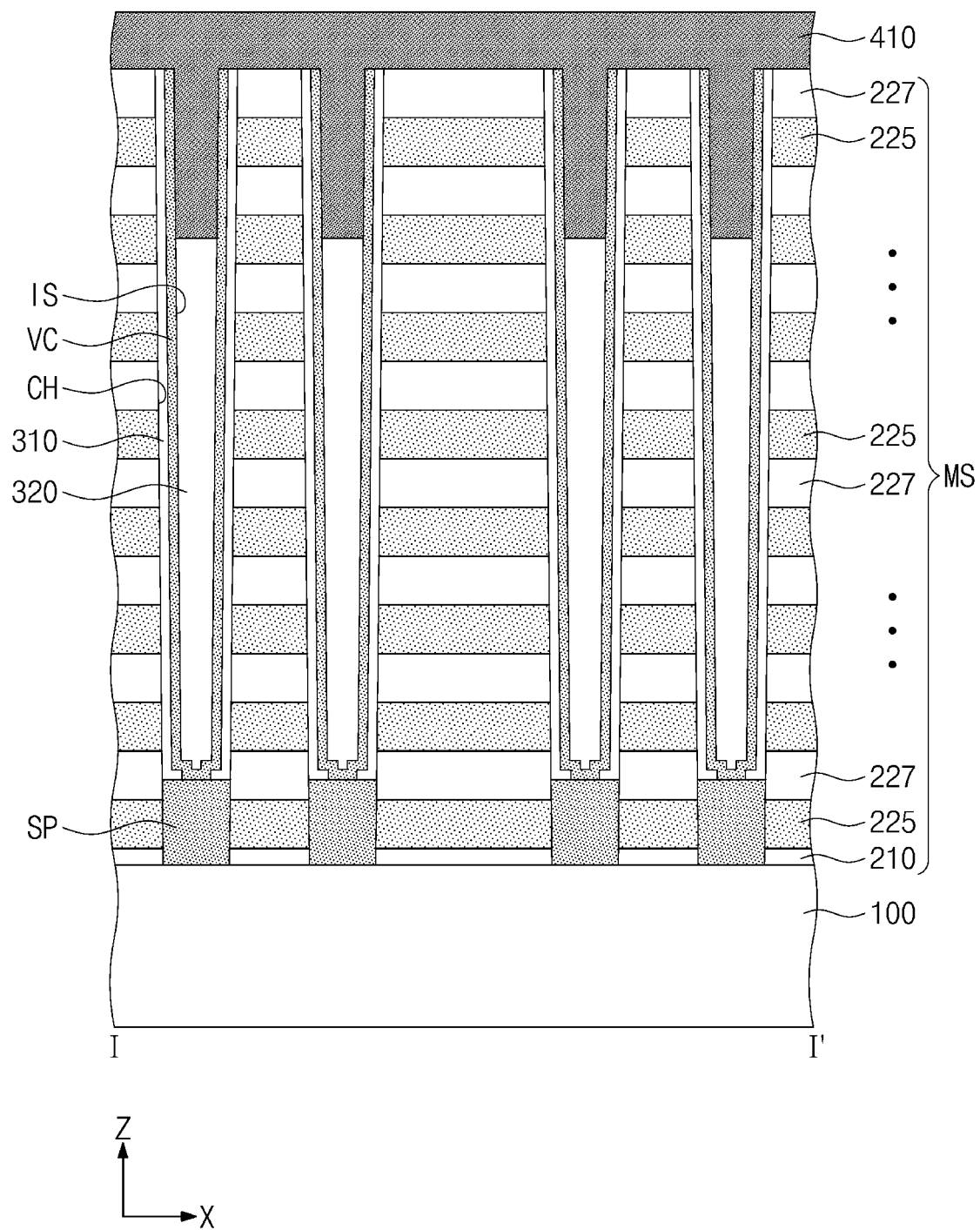

Referring to FIG. 11, an etching process may be performed to etch upper portions of the gap-fill layers 320. Thus, the inner spaces IS on top surfaces of the gap-fill layers 320 may be empty again. The top surfaces of the gap-fill layers 320 may be recessed from the top surface of the mold structure MS by the etching process. The top surfaces of the gap-fill layers 320 may be located at a level between a top surface and a bottom surface of a next-uppermost one of the sacrificial layers 225. For example, the etching process may be an etch-back process. A conductive layer 410 may be formed on the mold structure MS. The conductive layer 410 may cover the top surface of the mold structure MS and may fill the inner spaces IS on the gap-fill layers 320. For example, the conductive layer 410 may include a conductive material or a semiconductor material doped with dopants. For example, the conductive layer 410 may be formed to be in contact with top surfaces of the gap-fill layers 320, and the contact surfaces may be respectively disposed between top surfaces and bottom surfaces of the second farthest sacrificial layers 225 from the substrate 100.

Figure 12:
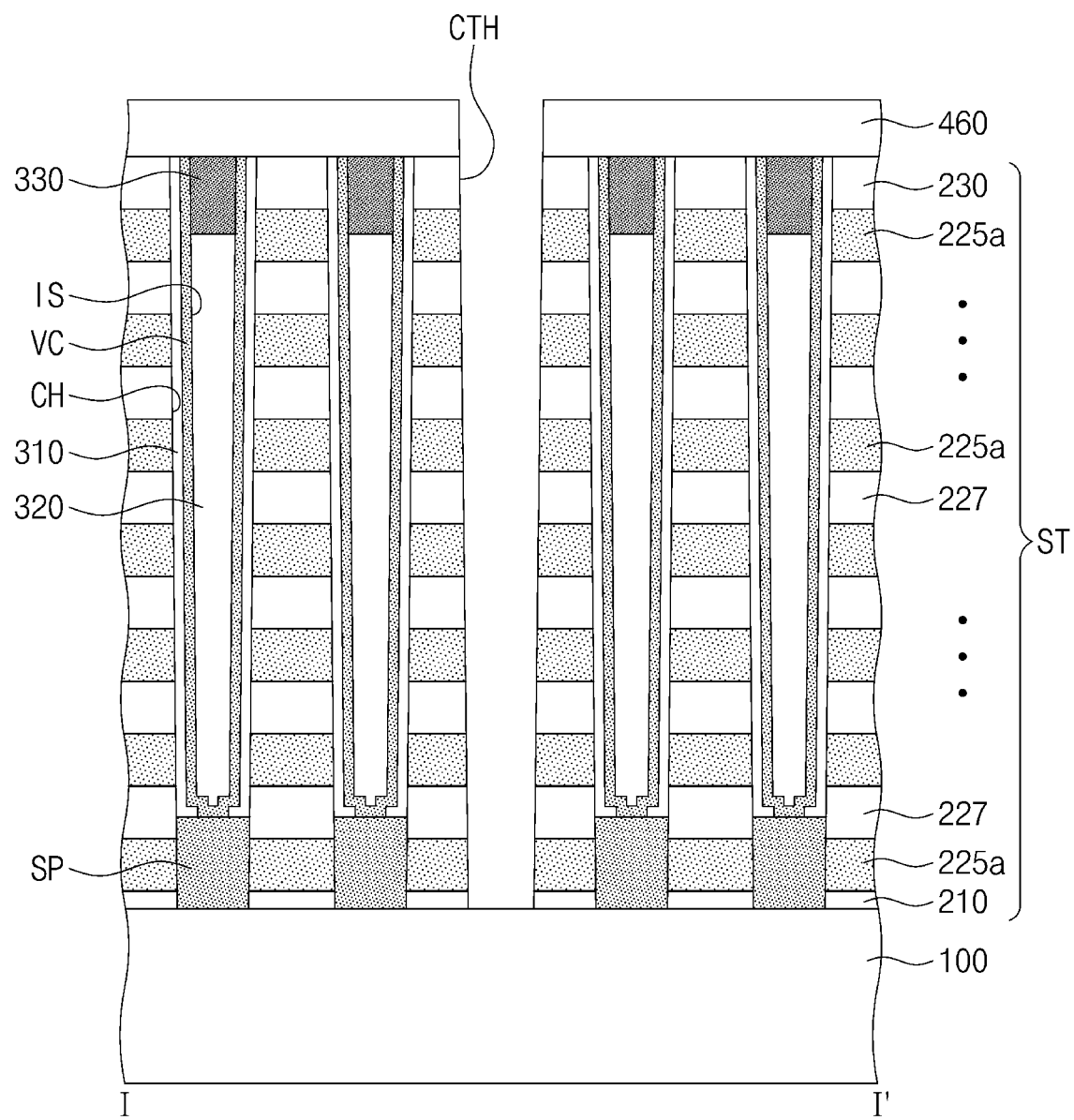

Referring to FIG. 12, a planarization process may be performed on the conductive layer 410 to form pads 330 on the gap-fill layers 320 in the inner spaces IS, respectively. The planarization process may be performed until a top surface of a next-uppermost one of the insulating layers 227 of the mold structure MS is exposed. For example, the uppermost insulating layer 227 and the uppermost sacrificial layer 225 of the mold structure MS may be used as an etch stop layer in the planarization process and may be removed by the planarization process. The planarization process may be a chemical mechanical polishing (CMP) process. For example, an upper portion (e.g., formed on the uppermost insulating layer 227) of the conductive layer 410 may be removed by an etching process before the CMP process.

An anisotropic etching process may be performed on the mold structure MS to form a common source trench CTH. In some embodiments, a first interlayer insulating layer 460 may be formed on the mold structure MS, and then, the first interlayer insulating layer 460 and the mold structure MS may be patterned until the top surface of the substrate 100 is exposed, thereby forming the common source trench CTH. The common source trench CTH may extend in the second direction Y (see FIG. 2). For example, the common source trench CTH may have a linear or rectangular shape extending in the second direction Y in a plan view. Since the common source trench CTH is formed, stack structures ST spaced apart from each other in the first direction X (see FIG. 2) may be formed on the substrate 100. For example, as shown in FIG. 2, common source trenches CTH divide the stack structures ST to be spaced apart from each other in the first direction X. Each of the stack structures ST may include a patterned buffer oxide layer 210, insulating patterns 230, and sacrificial patterns 225a. Sidewalls of the stack structures ST may be exposed by the common source trench CTH.

Figure 13:
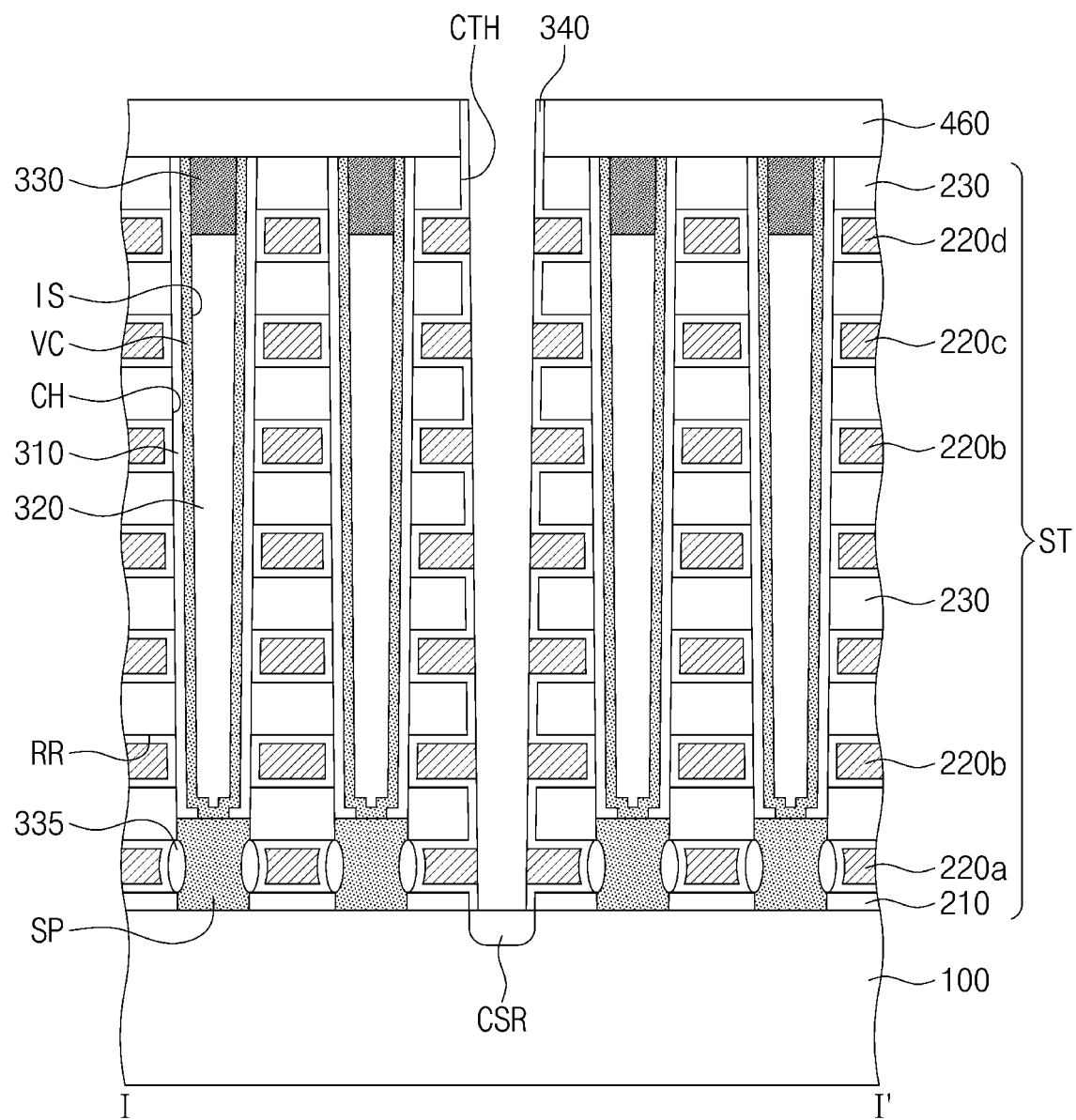

Referring to FIG. 13, recess regions RR may be formed by removing the sacrificial patterns 225a exposed by the common source trench CTH. The sacrificial patterns 225a may be removed by performing a wet etching process and/or an isotropic dry etching process. The recess regions RR may be formed between the insulating patterns 230 stacked in the third direction Z perpendicular to the top surface of the substrate 100 and between the buffer oxide layer 210 and a lowermost one of the insulating patterns 230. The etching process may be performed using an etching solution including phosphoric acid. A gate insulating layer 335 may be formed on a sidewall of each of the semiconductor pillars SP exposed by the recess region RR. The gate insulating layers 335 may be formed by performing an oxidation process on the sidewalls of the semiconductor pillars SP. The gate insulating layer 335 may include, for example, a thermal oxide layer or a silicon oxide layer. In certain embodiments, the gate insulating layer 335 may be a thermally oxidized silicon oxide layer.

A horizontal insulating layer 340 may be formed in the recess regions RR. For example, the horizontal insulating layer 340 may conformally cover outer sidewalls of the charge storage structures 310, sidewalls of the gate insulating layers 335, and top and bottom surfaces of the insulating patterns 230, which are exposed by the recess regions RR. The horizontal insulating layer 340 may conformally cover sidewalls of the insulating patterns 230 and sidewalls of the first interlayer insulating layer 460 which are exposed by the common source trench CTH. The horizontal insulating layer 340 may be formed using a deposition method having an excellent step coverage property. For example, the horizontal insulating layer 340 may be formed using a chemical vapor deposition (CVD) process or an atomic layer deposition (ALD) process. Gate electrodes 220a, 220b, 220c and 220d may be formed in the recess regions RR, e.g., on the horizontal insulating layer 340, respectively. In some embodiments, a metal layer may be formed in the common source trench CTH and the recess regions RR, and the metal layer formed in the common source trench CTH may be removed to form the gate electrodes 220a, 220b, 220c and 220d, e.g., by an etching process.

A common source region CSR may be formed in the substrate 100 exposed through the common source trench CTH. The common source region CSR may be formed using an ion implantation process. The common source region CSR may have a different conductivity type from that of the substrate 100.

Referring again to FIGS. 2 and 3, a contact structure 470 may be formed in the common source trench CTH. The contact structure 470 may include a spacer 471 and a common source contact 473. The spacer 471 may cover sidewalls of the common source trench CTH. The common source contact 473 may be formed to fill a remaining space of the common source trench CTH having the spacer 471. A second interlayer insulating layer 480 may be formed on the first interlayer insulating layer 460. The second interlayer insulating layer 480 may cover a top surface of the contact structure 470 and a top surface of the first interlayer insulating layer 460. For example, the second interlayer insulating layer 480 may include a silicon oxide layer.

Cell contact plugs CCP may be formed on end portions of the gate electrodes 220a, 220b, 220c and 220d, which are disposed on the pad region PR of the substrate 100. The cell contact plugs CCP may be electrically connected to the gate electrodes 220a, 220b, 220c and 220d, respectively. Channel contact plugs HCP may be formed on the pads 330. The channel contact plugs HCP may penetrate the second and first interlayer insulating layers 480 and 460 and may be in contact with the pads 330.

Bit lines BL may be formed on the second interlayer insulating layer 480. Each of the bit lines BL may be electrically connected to the vertical channel portions VC arranged in the first direction X.

According to the embodiments of the inventive concepts, the erase gate electrode 220d disposed at the uppermost layer of the gate electrodes may horizontally overlap with the pad 330 disposed in the inner space surrounded by the vertical channel portion VC. As a result, in the erase operation, the GIDL phenomenon may be easily induced between the erase gate electrode 220d and the pad 330, and thus the holes may be smoothly supplied into the vertical channel portion VC.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A three-dimensional (3D) semiconductor memory device comprising:
   a stack structure extending in a first direction and comprising gate electrodes sequentially stacked on a substrate;
   a vertical channel structure penetrating the stack structure and a portion of the substrate;
   a conductive pad disposed in an inner space of and surrounded by the vertical channel structure; and
   a contact structure extending in the first direction and penetrating the stack structure,
   wherein a top surface of the substrate is recessed by the vertical channel structure penetrating the portion of the substrate,
      wherein the gate electrodes comprise a ground selection gate electrode, a cell gate electrode, a string selection gate electrode, a first erase gate electrode, and a second erase gate electrode, which are sequentially stacked on the substrate,
      wherein the second erase gate electrode is an uppermost one of the gate electrodes,
   wherein a top surface of the conductive pad is higher than a top surface of the second erase gate electrode and lower than a top surface of the contact structure, and
   wherein a bottom surface of the conductive pad is located at a vertical level between a top surface and a bottom surface of the first erase gate electrode.

2. The 3D semiconductor memory device of claim 1, wherein the conductive pad and the first erase gate electrode each include a portion at the same vertical level.

3. The 3D semiconductor memory device of claim 1, further comprising:
   a bit line extending in a second direction and crossing the stack structure and the contact structure; and
   a bit line contact plug connecting the bit line with the vertical channel structure.

4. The 3D semiconductor memory device of claim 1,
wherein a top surface of the conductive pad is located at the same vertical level as a top surface of the vertical channel structure.

5. The 3D semiconductor memory device of claim 1, wherein the first erase gate electrode, the ground selection gate electrode, the cell gate electrode, and the string selection gate electrode are each formed of the same material.

6. The 3D semiconductor memory device of claim 1, wherein the gate electrodes further comprise a second erase gate electrode disposed above the first erase gate electrode.

7. The 3D semiconductor memory device of claim 1, further comprising
a gap-fill layer disposed under the conductive pad in the inner space.

8. The 3D semiconductor memory device of claim 7,
wherein the vertical channel structure comprises a first portion disposed between the gap-fill layer and the stack structure and a second portion disposed between the conductive pad and the stack structure, and
wherein the first portion and the second portion are formed of an intrinsic semiconductor material.

9. The 3D semiconductor memory device of claim 1, wherein the first erase gate electrode is an uppermost one of the gate electrodes.

10. The 3D semiconductor memory device of claim 1, further comprising:
a semiconductor pillar disposed between the substrate and the vertical channel structure, the semiconductor pillar penetrating the ground selection gate electrode.

11. The 3D semiconductor memory device of claim 1,
wherein the stack structure further comprises a second erase gate electrode and a source conductive pattern,
wherein the second erase gate electrode is disposed between the substrate and the ground selection gate electrode, and
wherein the source conductive pattern is disposed between the substrate and the second erase gate electrode.

12. A three-dimensional (3D) semiconductor memory device comprising:
a first erase gate electrode and a second erase gate electrode formed on a substrate;
a vertical channel structure disposed on the substrate and penetrating the first and second erase gate electrodes and a portion of the substrate;
a conductive pad disposed in an inner space surrounded by the vertical channel structure; and
a contact structure extending vertically and penetrating the first and second erase gate electrodes,
wherein a top surface of the substrate is recessed by the vertical channel structure penetrating the portion of the substrate,
wherein the conductive pad and the first erase gate electrode each include a portion at the same vertical level,
wherein a top surface of the conductive pad is higher than a top surface of the second erase gate electrode and lower than a top surface of the contact structure, and
wherein a bottom surface of the conductive pad is disposed at a vertical level between a bottom surface and a top surface of the first erase gate electrode, and a top surface of the conductive pad is disposed at the same vertical level as a top surface of the vertical channel structure.

13. The 3D semiconductor memory device of claim 12, wherein a top surface of the vertical channel structure is lower than the top surface of the contact structure.

14. The 3D semiconductor memory device of claim 12, further comprising:
a second erase gate electrode disposed adjacent to the first erase gate electrode,
wherein the conductive pad and the second erase gate electrode each include a portion at the same vertical level.

15. The 3D semiconductor memory device of claim 12, further comprising:
a string selection gate electrode disposed between the first erase gate electrode and the substrate,
wherein the bottom surface of the conductive pad is located at a higher vertical level than a top surface of the string selection gate electrode.

16. The 3D semiconductor memory device of claim 12, further comprising:
a cell gate electrode disposed between the first erase gate electrode and the substrate.

17. A three-dimensional (3D) semiconductor memory device comprising:
a first gate electrode and a second gate electrode sequentially stacked on a substrate;
a vertical channel structure disposed on the substrate and penetrating the first and second gate electrodes and a portion of the substrate; and
a conductive pad disposed in an inner space surrounded by the vertical channel structure; and
a contact structure extending vertically and penetrating the first and second gate electrodes,
wherein a top surface of the conductive pad is higher than a top surface of the second gate electrode and lower than a top surface of the contact structure,
wherein a top surface of the substrate is recessed by the vertical channel structure penetrating the portion of the substrate, and
wherein a bottom surface of the conductive pad is located at a vertical level between a top surface and a bottom surface of the first gate electrode.

18. The 3D semiconductor memory device of claim 17, wherein the first gate electrode and the second gate electrode are erase gate electrodes.

19. The 3D semiconductor memory device of claim 17, further comprising:
a ground selection gate electrode, a cell gate electrode, and a string selection gate electrode, which are stacked on the substrate between the first gate electrode and the substrate.

20. The 3D semiconductor memory device of claim 17, wherein a top surface of the conductive pad is located at the same vertical level as a top surface of the vertical channel structure.

* * * * *